United States Patent [19]

Hayashi et al.

[11] 4,437,143
[45] Mar. 13, 1984

[54] RETRACTABLE HEADLAMP ASSEMBLY FOR AUTOMOBILES

[75] Inventors: Motomu Hayashi, Okazaki; Atuo Ishikawa, Toyota; Kazuyoshi Yukimoto, Kariya, all of Japan

[73] Assignee: Aisin Seiki Kabushiki Kaisha, Kariya, Japan

[21] Appl. No.: 369,366

[22] Filed: Apr. 19, 1982

[30] Foreign Application Priority Data

Apr. 22, 1981 [JP] Japan .................. 56-058383

[51] Int. Cl.³ .............................. H01G 1/06
[52] U.S. Cl. ........................ 362/272; 362/66; 362/65; 362/286; 362/287; 362/372; 362/427; 362/428
[58] Field of Search .............. 362/65, 66, 80, 83, 362/285–287, 269, 272, 372, 418, 427, 428

[56] References Cited

U.S. PATENT DOCUMENTS 2,119,892  6/1938  Snow ............................ 362/65
4,246,628  1/1981  Ikemizu et al. .................. 362/66

*Primary Examiner*—Stephen J. Lechert, Jr.
*Assistant Examiner*—Howard J. Locker
*Attorney, Agent, or Firm*—Finnegan, Henderson, Farabow, Garrett & Dunner

[57] ABSTRACT

A retractable headlamp assembly for automobiles in which a headlamp, pivotally mounted on the automobile frame, is operatively coupled to the rotatable shaft of a motor by a link mechanism. The motor, operating through the link mechanism, is energizable to cause the headlamp to be moved angularly between a first position at which the headlamp projects out of the front hood of the automobile, and a second position at which the headlamp is retracted within the front hood. An adjustable stop is provided to stop the headlamp at the first position, which adjustable stop is adjusted to bring the first position into conformity with an angularly displaced position of the rotatable motor shaft, which is displaced through a slip angle from a normal stopping position. Such an arrangement assures that the headlamp can be stopped at a fixed position at all times for emitting a correctly directed beam of light irrespective of the varying positions at which the motor can stop.

3 Claims, 2 Drawing Figures

RETRACTABLE HEADLAMP ASSEMBLY FOR AUTOMOBILES

BACKGROUND OF THE INVENTION

This invention relates to improvements in a retractable headlamp assembly for use on automobiles.

Many automobiles now come equipped with retractable or "pop-up" headlamp assemblies. With such an assembly the headlamp when not in use is kept in a retracted position to conceal it within an opening provided within the front hood of the vehicle. When the driving conditions require it, the headlamp is caused to protrude from the opening and is pointed in the direction of travel, at which time the lamp is turned on. When the headlamp is projected from the front hood in this manner it is important that the headlamp come to rest at the correct position in order to direct the beam properly, particularly in such fashion that the beam will not shine in the eyes of a driver in an approaching vehicle.

The conventional retractable headlamp assembly includes the headlamp located on the front hood and pivotally mounted so as to be popped up and retracted at will, a motor for driving the headlamp between the popped-up and retracted positions, and a link mechanism for coupling the headlamp to the motor so that the headlamp may be moved between said two positions. The motor is adapted to be stopped at two positions, one corresponding to the popped-up position, the other to the retracted position. However, due to such phenomena as backlash and inertia, the position at which the motor stops to pop up the headlamp is not always the same, with the result that the popped-up headlamp itself is sometimes displaced from the correct position. Since such displacement mis-directs the optical axis of the headlamp beam, the beam may momentarily blind the driver in an oncoming vehicle.

BRIEF SUMMARY OF THE INVENTION

Accordingly, an object of the present invention is to provide a retractable headlamp assembly in which the headlamp can be stopped at a fixed position at all times for emitting a correctly directed beam of light irrespective of the varying positions at which the motor can stop.

According to the present invention, the foregoing object is attained by providing a retractable headlamp assembly for automobiles in which the headlamp is pivotally mounted on a bracket provided on the automobile frame. A motor having a rotatable shaft also is mounted on the bracket and is de-energizable to stop the rotatable shaft within an angular interval between a normal stop position and an angularly displaced position which is angularly spaced through a slip angle from the normal stop position. A lamp link is fixed to the headlamp and is operatively coupled to the rotatable motor shaft by a link mechanism. When the motor is energized, the headlamp is angularly moved through the link mechanism between a first position at which the headlamp projects out of the front hood, and a second position at which the headlamp is retracted within the front hood. An adjustable stop is secured to the bracket for stopping the headlamp at the first position. The adjustable stop is adjusted to bring the first position into conformity with the angularly displaced position.

Other features and advantages of the invention will be apparent from the following description taken in conjunction with the accompanying drawings in which like characters designate the same or similar parts throughout the figures thereof.

DESCRIPTION OF THE PREFERRED EMBODIMENT

Figure 1:
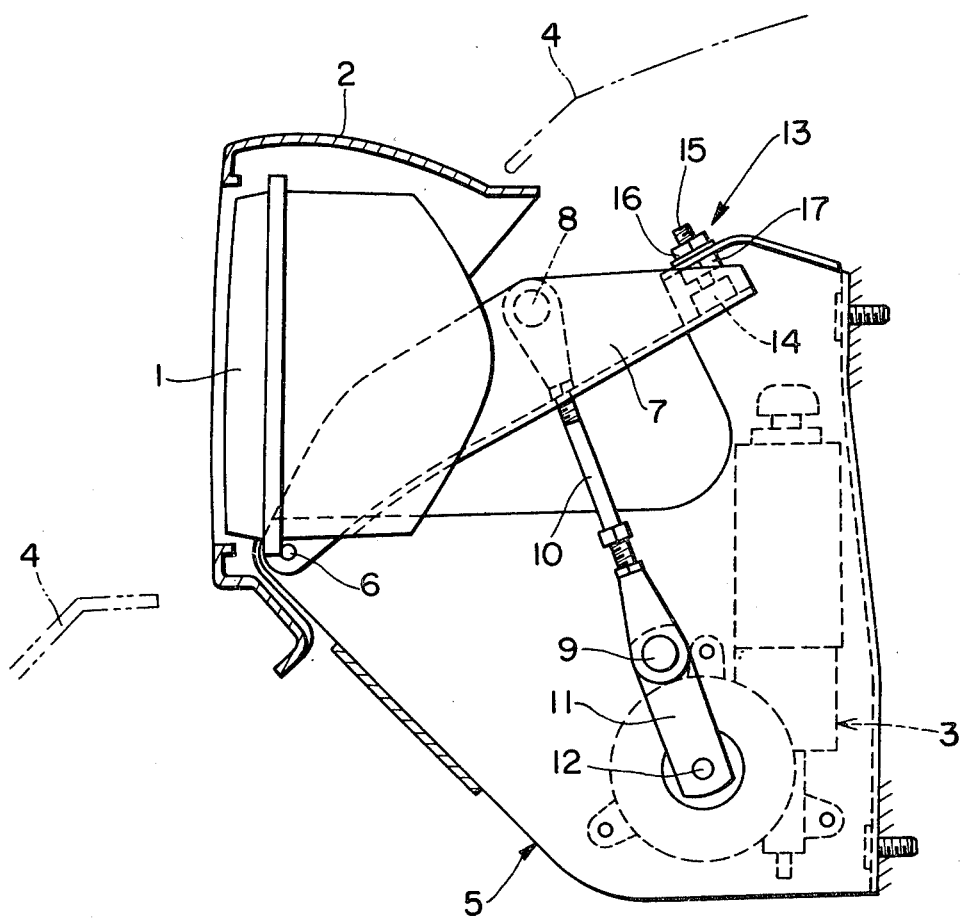
FIG. 1 is a side elevational view, with parts in cross section, of a retractable headlamp assembly for use on automobiles, in accordance with the present invention.

As shown in FIG. 1, a retractable or "pop-up" headlamp assembly for use on an automobile generally comprises a headlamp 1, a headlamp protective cover 2 extending around the headlamp 1, and a motor 3 operatively connected to the headlamp 1 for selectively raising or retracting the headlamp 1. The headlamp 1 and the protective cover 2 are secured together and pivotally mounted by a pin 6 at their lower end on a bracket 5 which is disposed below a front hood 4 of the automobile and fastened to a suitable automobile frame. The headlamp 1 and the protective cover 2 are thus angularly movable about the pin 6 upwardly and downwardly through an opening in the front hood 4. The motor 3 is also affixed to the bracket 5.

A lamp link 7 is mounted fixedly on the headlamp 1 for angular movement therewith, and extends substantially rearwardly of the headlamp 1. The lamp link 7 is operatively connected to the motor 3 by a link mechanism. The link mechanism comprises a first ball joint 8 operatively connected to the lamp link 7, a link rod 10 operatively connected at its upper end to the first ball joint 8, a second ball joint 9 operatively connected to the lower end of the link rod 10, and a motor link 11 operatively connected at its upper end to the second ball joint 9 and affixed to a rotatable shaft 12 of the motor 3. The motor 3 is energizable to cause the headlamp to be angularly moved through the link mechanism between a first or projecting position at which the headlamp 1 is projected upwardly out of the front hood 4 and turned on with the optical axis of the headlamp 1 oriented in a desired direction, and a second or retracted position at which the headlamp 1 is retracted downwardly within the front hood 4 and turned off.

An adjustable stop 13 is mounted on an upper portion of the bracket 5 for coaction with an abutment 14 attached to a distal end of the lamp link 7 to stop the headlamp 1 at the projecting position. The adjustable stop 13 is composed of a threaded pin 15 and a pair of nuts 16, 17 that are held in threaded engagement with the threaded pin 15 and retain the latter in a fixed position with respect to the bracket 5. By loosening the nuts 16, 17 and turning the threaded pin 15, the position at which the lamp link 7 can be stopped in abutting engagement with the threaded pin 15, namely the projecting position of the headlamp 1, can be adjusted as desired.

According to the present invention, the projecting position of the headlamp 1 is selected by adjusting the threaded pin 15 in a manner to be described with reference to FIG. 2.

Figure 2:
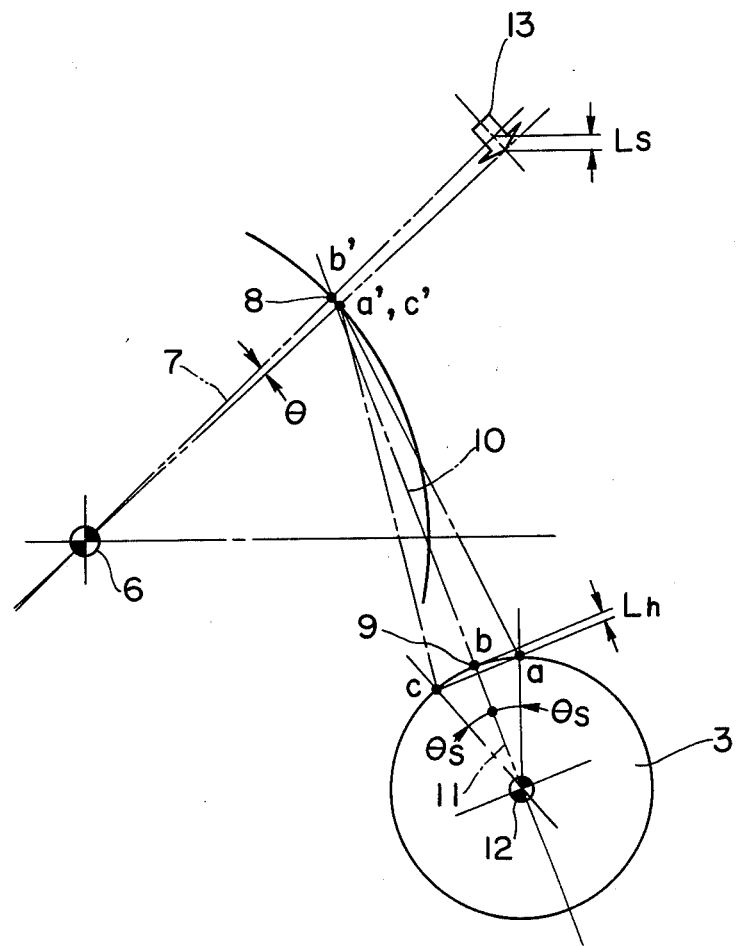
FIG. 2 is a diagram illustrative of the angular positions of parts of a link mechanism and a lamp link of the retractable headlamp assembly.

FIG. 2 is a diagram showing various angular positions that the parts of the link mechanism and the lamp link will take when the motor 3 is energized to bring the headlamp 1 to the projecting position. More specifically, when the motor 3 is de-energized with the headlamp 1 in the projecting position, the shaft 12 of the motor 3 can stop at an angularly displaced position which is angularly spaced through a slip angle $\theta_s$ from a normal stop position on either side thereof. When the motor shaft 12 is thus stopped, the motor link 11 can stop at a limit position a or c which is angularly spaced through the slip angle $\theta_s$ from a normal position b. The lamp link 7 can also stop at a limit position (a',c') which is angularly spaced from a normal position b' through an angle $\theta$ which is related to the slip angle $\theta_s$. Thus, the positions a, c correspond to the position (a',c'), and the position b corresponds to the position b'.

In general, the position at which the motor 3 is stopped upon de-energization may be deviated from the normal position b on either side thereof through the slip angle $\theta_s$ because of inertia, backlash or other factors. If the motor link 11 were allowed to take the angular position b on some occasions or the angular positions a, c on others, the stop position of the lamp link 7 would vary through the angle $\theta$. As a result, the optical axis of the headlamp 1, when in the projecting position, would be deflected to such an extent that the beam of light from the headlamp 1 could momentarily blind the driver in an oncoming car.

With the arrangement of the present invention, the stop position of the lamp link 7 at which the optical axis of the projected headlamp 1 is correctly directed, is selected to be the position (a',c') which corresponds to the positions a, c that are deviated through the slip angle $\theta_s$ from the normal position b. To stop the lamp link 7 at the position (a',c'), the threaded pin 15 (FIG. 1) is turned so as to move toward the lamp link 7 by a distance $L_s$ which corresponds to the angle $\theta$. The lamp link 7 will be forced to stop at the position (a',c') at all times even if the motor 3 should stop at the angularly displaced position which is angularly spaced through the slip angle $\theta_s$ from the normal stop position. Therefore, the optical axis of the headlamp 1 is prevented from varying from the desired orientation which is determined by the lamp link 7 when brought to the position (a',c'). When the motor link 11 is forced to move angularly past the position b toward the position a, the motor link 11 is caused to undergo longitudinal elongation for an additional interval $L_h$, which however can be taken up by the first and second ball joints 8, 9.

With the arrangement of the present invention, the headlamp 1 can be stopped at a fixed position at all times for emitting a correctly directed beam of light irrespective of the varying positions at which the motor can stop. The headlamp 1 as it projects out of the hood 4 and is turned on has it optical axis kept stationary against fluctuation or displacement, unlike the conventional retractable headlamp where such fluctuation or displacement could direct the beam into the eyes of a driver in an approaching vehicle.

As many apparently widely different embodiments of the present invention can be made without departing from the spirit and scope thereof, it is to be understood that the invention is not limited to the specific embodiments thereof except as defined in the appended claims.

What is claimed is:

1. A retractable headlamp assembly for use on an automobile frame having a front hood, comprising:
   a bracket adapted to be mounted on the automobile frame;
   a headlamp pivotably mounted on said bracket;
   a lamp link fixed to said headlamp;
   a motor mounted on said bracket and having a rotatable shaft, said motor being de-energizable to stop said rotatable shaft within an angular interval between a normal stop position and an angularly displaced position which is angularly spaced through a slip angle from said normal stop position;
   a link mechanism operatively connected to and extending between said lamp link and said rotatable shaft, said motor being energizable to cause said headlamp to be angularly moved through said link mechanism between a first position at which said headlamp projects out of the front hood and is turned on, and a second position at which said headlamp is retracted within said front hood and turned off; and
   adjustable stop means for determining said first position in conformance with the slip angle of said angularly displaced stop position of said motor.

2. A retractable headlamp assembly according to claim 1, wherein said adjustable stop comprises a threaded pin and at least one nut held in threaded engagement with said threaded pin and retaining the latter with respect to said bracket, said lamp link being engageable with said threaded pin when said headlamp is in said first position.

3. A retractable headlamp assembly according to claim 1, wherein said link mechanism comprises a link rod, a motor link fixedly connected to said rotatable shaft, a first ball joint operatively connecting one end of said link rod to said lamp link, and a second ball joint operatively connecting the other end of said link rod to said motor link.

* * * * *